(12) United States Patent
Marx et al.

(10) Patent No.: US 7,154,286 B1
(45) Date of Patent: Dec. 26, 2006

(54) DUAL TAPERED SPRING PROBE

(75) Inventors: Donald A. Marx, Olathe, KS (US); William E. Thurston, Kansas City, MO (US)

(73) Assignee: Interconnect Devices, Inc., Kansas City, KS (US)

( * ) Notice: Subject to any disclaimer, the term of this patent is extended or adjusted under 35 U.S.C. 154(b) by 0 days.

(21) Appl. No.: 11/172,275

(22) Filed: Jun. 30, 2005

(51) Int. Cl.
  *G01R 31/02* (2006.01)
  *H01R 13/24* (2006.01)
(52) U.S. Cl. .................. 324/761; 439/700; 439/824
(58) Field of Classification Search .............. None
  See application file for complete search history.

(56) References Cited

U.S. PATENT DOCUMENTS

| | | | | |
|---|---|---|---|---|
| 2,549,731 A * | 4/1951 | Wattley | ............ | 439/482 |
| 3,435,168 A * | 3/1969 | Cooney | ............ | 200/266 |
| 4,105,970 A * | 8/1978 | Katz | ............ | 324/761 |
| 4,200,351 A * | 4/1980 | Long et al. | ............ | 439/824 |
| 4,438,397 A * | 3/1984 | Katz | ............ | 324/761 |
| 4,508,405 A * | 4/1985 | Damon et al. | ............ | 439/260 |
| 4,636,026 A * | 1/1987 | Cooney et al. | ............ | 439/482 |
| 4,659,987 A * | 4/1987 | Coe et al. | ............ | 324/754 |
| 4,774,462 A * | 9/1988 | Black | ............ | 324/758 |
| 4,851,765 A * | 7/1989 | Driller et al. | ............ | 324/761 |
| 4,978,312 A * | 12/1990 | Fodali | ............ | 439/219 |
| 5,009,613 A * | 4/1991 | Langgard et al. | ............ | 439/482 |
| 5,174,763 A * | 12/1992 | Wilson | ............ | 439/66 |
| 5,225,773 A * | 7/1993 | Richards | ............ | 324/754 |
| 5,227,718 A * | 7/1993 | Stowers et al. | ............ | 324/761 |
| 5,744,977 A * | 4/1998 | Cuautla | ............ | 324/761 |
| 5,781,023 A * | 7/1998 | Swart et al. | ............ | 324/761 |
| 5,990,697 A * | 11/1999 | Kazama | ............ | 324/761 |
| 6,323,667 B1 * | 11/2001 | Kazama | ............ | 324/761 |
| 6,337,572 B1 * | 1/2002 | Kazama | ............ | 324/754 |
| 6,377,059 B1 * | 4/2002 | Vinther et al. | ............ | 324/754 |
| 6,396,293 B1 * | 5/2002 | Vinther et al. | ............ | 324/761 |
| 6,424,166 B1 * | 7/2002 | Henry et al. | ............ | 324/755 |
| 6,462,567 B1 * | 10/2002 | Vinther et al. | ............ | 324/754 |
| 6,506,082 B1 * | 1/2003 | Meek et al. | ............ | 439/700 |
| 6,565,395 B1 * | 5/2003 | Schwarz | ............ | 439/840 |
| 6,773,312 B1 * | 8/2004 | Bauer et al. | ............ | 439/824 |
| 6,844,749 B1 * | 1/2005 | Sinclair | ............ | 324/761 |
| 6,861,862 B1 * | 3/2005 | Tate | ............ | 324/761 |
| 6,908,347 B1 * | 6/2005 | Sasaki | ............ | 439/824 |
| 6,937,045 B1 * | 8/2005 | Sinclair | ............ | 324/761 |
| 6,992,496 B1 * | 1/2006 | Winter et al. | ............ | 324/755 |
| 2003/0176113 A1 * | 9/2003 | Sasaki | ............ | 439/700 |
| 2005/0280433 A1 * | 12/2005 | Nelson et al. | ............ | 324/761 |

FOREIGN PATENT DOCUMENTS

| | | |
|---|---|---|
| EP | 245787 A1 * | 11/1987 |
| EP | 361689 A1 * | 4/1990 |
| EP | 426275 A2 * | 5/1991 |

(Continued)

OTHER PUBLICATIONS

"Product Close-up: Less is More with New Center Probe Test-Socket Technology" by Bruce Dechillo and Frank Folmsbee, published in Nov./Dec. 2004 Chip Scale Review, pp. 43-47.

*Primary Examiner*—Paresh Patel
(74) *Attorney, Agent, or Firm*—Chase Law Firm, L.C.

(57) ABSTRACT

A contact spring probe includes a plunger and a spring with a pair of opposed closed coils separated by an open coil. The plunger is secured at one end to one set of closed coils with a shoulder, flange or barb extending from the body of the plunger.

6 Claims, 2 Drawing Sheets

FOREIGN PATENT DOCUMENTS

| | | | |
|---|---|---|---|
| EP | 1172658 A2 * | 1/2002 | |
| GB | 2066590 A * | 7/1981 | |
| JP | 02234370 A * | 9/1990 | |
| JP | 06342012 A * | 12/1994 | |

* cited by examiner

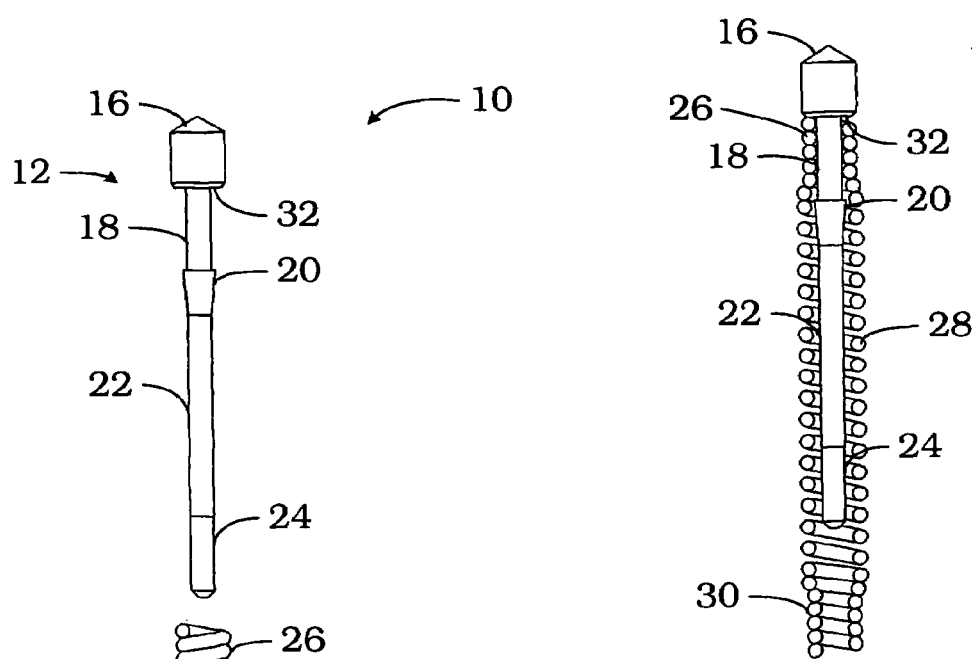
Fig. 2
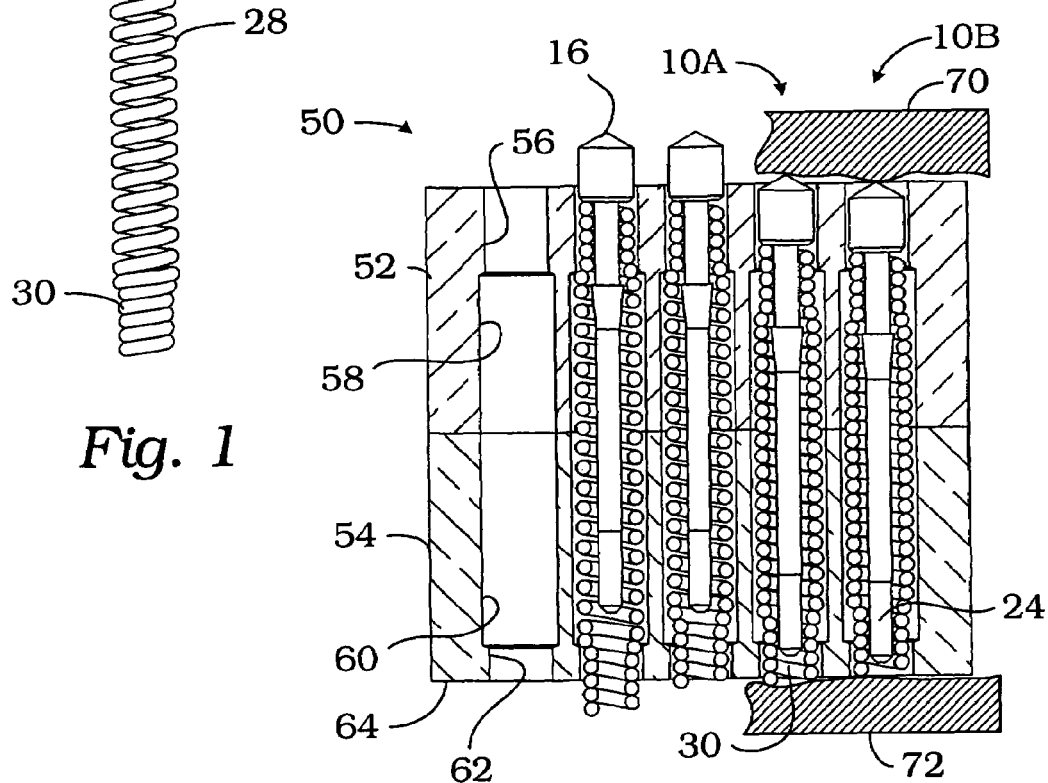
Fig. 1
Fig. 3

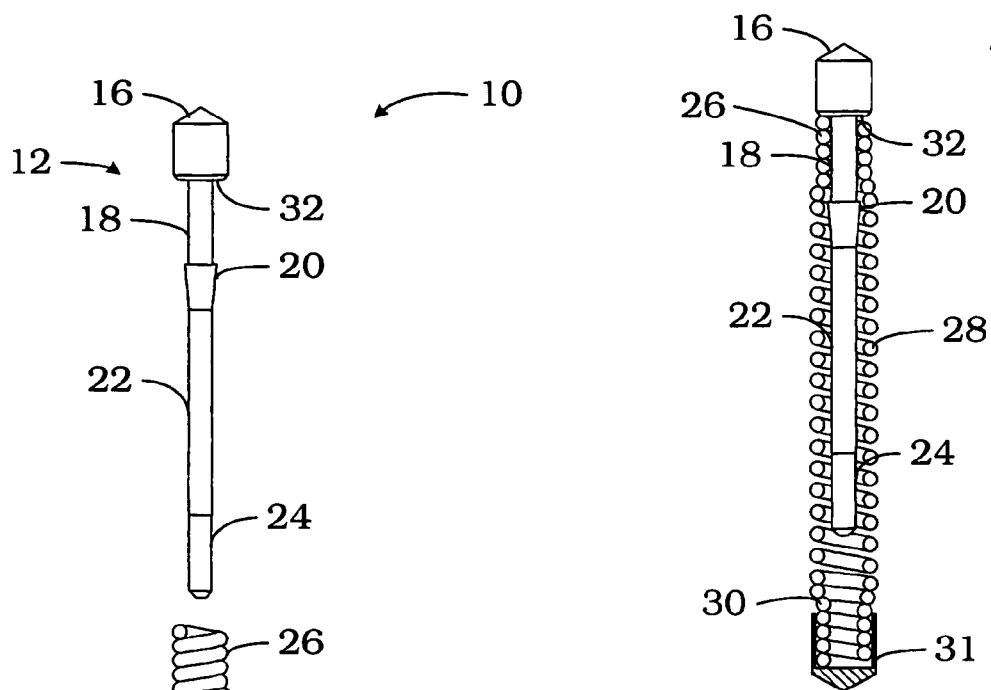
Fig. 4
Fig. 5
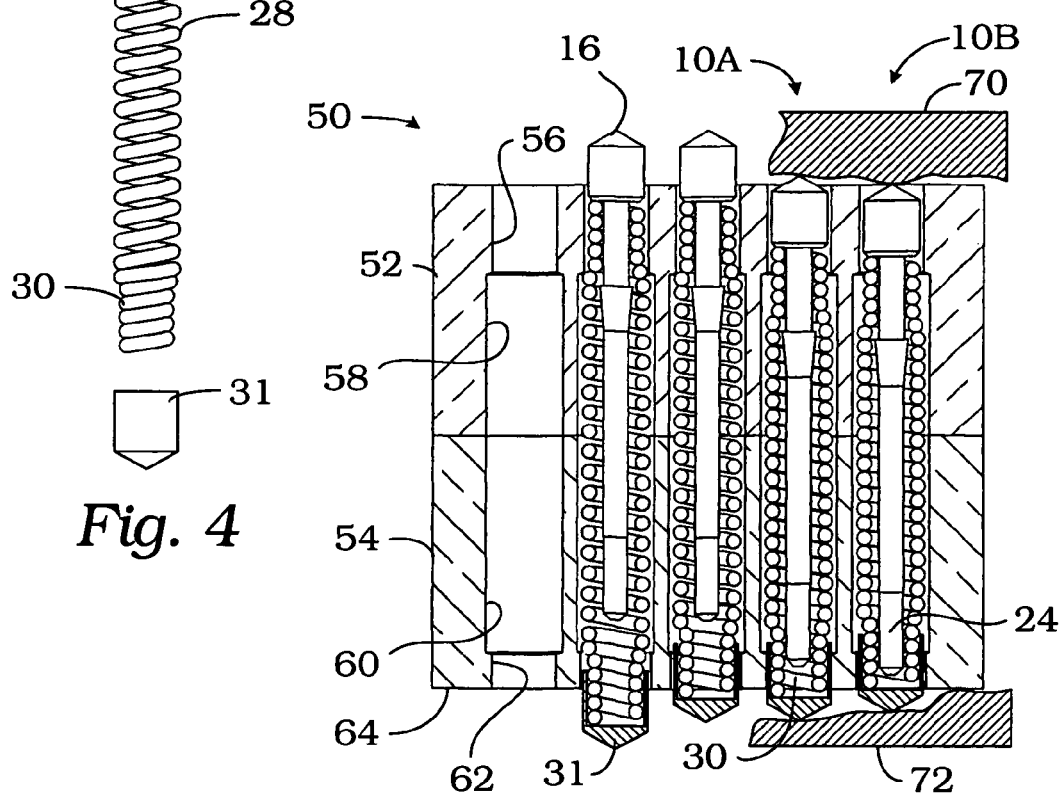
Fig. 6

DUAL TAPERED SPRING PROBE

FIELD OF THE INVENTION

This invention relates to contact spring probes and, more particularly, to a contact spring probe with a dual tapered spring and plunger retained by the spring.

BACKGROUND OF THE INVENTION

Contact spring probes are known in the art. The typical contact spring probe includes a barrel, a plunger and a spring which urges the plunger outwardly from the barrel. The spring and plunger are encapsulated by the barrel which is press-fit into a socket of a test fixture. The electrical conduction path from the probe tip to the socket is typically from the probe to the spring, to the barrel to the socket, or from the probe to the barrel to the socket. Long signal paths may reduce or degrade the electrical performance of the probe and may contribute to mechanical degradation or failure.

SUMMARY OF THE INVENTION

The present invention provides a contact spring probe with a dual tapered spring with closed coils at each end separated by open active coils, and a plunger with an elongated tail and secured by the closed coils at one end.

BRIEF DESCRIPTION OF THE DRAWINGS

FIG. 1 is an illustration of the probe of the present invention shown prior to assembly.

FIG. 2 is an illustration of the probe of FIG. 1 shown assembled with a sectional view of the spring.

FIG. 3 is an illustration of several probes mounted in a fixture.

FIG. 4 is an illustration of the probe of FIG. 1 shown prior to assembly and including an end cap.

FIG. 5 is an illustration of the probe of FIG. 4 shown assembled with a sectional view of the spring and end cap.

FIG. 6 is an illustration of several probes with end caps mounted in a fixture.

DETAILED DESCRIPTION

Referring to FIGS. 1 and 2, a contact spring probe of the present invention is generally indicated by reference numeral 10. Probe 10 includes a plunger 12 and a spring 14. Plunger 12 includes a tip 16, a shaft 18, a flange or shoulder 20, a body 22 and a tail 24. Plunger 12 may be fabricated by various methods such as machining from a single piece of conductive material such as beryllium copper or steel or the like and may be plated with gold or other material. The tip 16 illustrated is a 120° convex tip which is used to test plated through holes, pads and lands. The smooth cone shape allows plated through holes to be tested with minimal wetness marks to the device or unit under test. The point of the tip 16 is used to test pads and lands. Tip 16 is one example of many probe tips that may be used such as a spear point tip, a flat tip, a 60° chisel tip or an 8-point crown tip, for example. The particular tip configuration may be chosen as appropriate for a particular use or application. It should be understood that the tip illustrated and the types of tips listed hereinabove are for illustrative purposes only and not as limitations or as an exhaustive list.

Shaft 18 extends from the tip 16 to the shoulder 20. Shoulder 20 may be an inverted frustoconically shaped element which flares outwardly from shaft 18 to present a flange and then tapers to the body 22. The diameter of the shaft 18 may be approximately equal to the diameter of the body 22. The body 22 is generally elongated and extends to the tail 24 which has a diameter approximately equal to or smaller than the diameter of the plunger body 22.

The spring 14 is generally helical. The first closed coils 26 are tightly wound with an inside diameter approximately equal to the diameter of the plunger shaft 18. The first closed coils 26 transition into the open coils 28. The open coils 28 are active with an inside diameter greater than the diameter of the plunger body 22. The open coils 28 transition into the second set of closed coils 30. The second closed coils 30 are tightly wound with an inside diameter equal to or slightly less than the diameter of the plunger Body 22. Spring 14 may be symmetrical with the number of coils in and the inside diameter of the first set of closed coils 26 equal to the number of coils in and the inside diameter of the second set of closed coils 30. A symmetrical configuration of spring 14 helps reduce the cost of manufacturing the spring 14 and assembly of the probe 10. With a symmetrical spring 14 there is no orientation of the spring 14 for assembly. Thus, the plunger 12 may be inserted into either end of the spring 14 to reduce or eliminate assembly complexity, details and errors that may accompany assembly of asymmetrical components.

The probe 10 is assembled by inserting the plunger 12 into the spring 14. The plunger tail 24 and body 22 are first inserted into the closed coils 26. As the plunger 12 is inserted, the first closed coils 26 are forced apart by frustoconical shoulder 20 until the first closed coils contact a base 32 of the plunger tip 16, and are seated around the shaft 18. The shoulder 20 grip the closed coils to secure the plunger 12 in place. One or more barbs or a flange may also be used to grip the closed coils and secure the plunger 12 in place.

Referring to FIG. 3, probe 10 is shown inserted in a fixture or interposer 50. Fixture 50 includes upper 52 and lower 54 plates. The upper fixture plate 52 includes a tip bore 56 and an open coil bore 58, which are axially aligned. Tip bore 56 has an inside diameter greater than the diameter of the plunger tip 16 and first closed coils 26, and less than the diameter of the open coils 28 of spring 14. The open coil bore 58 has an inside diameter greater than the outside diameter of the open coils 28.

The lower fixture plate 54 includes an open coil bore 60 and a tail bore 62, which may be axially aligned or the tail bore 62 may be offset to ensure good electrical contact with the closed coils 30. Open coil bore 60 and tail bore 62 have inside diameters generally equal to the open coil bore 58 and tip bore 56 of the upper fixture plate 52, respectively. The thickness of the lower fixture plate 54 may be generally equal to the thickness of the upper fixture plate 52.

To assemble the probes 10 in the fixture 50, the closed coils 30 and tails 24 of the probes 10 are inserted into the open coil bores 60 and tail bores 62. The closed coils 30 may extend below the lower surface 64 of the lower fixture plate 54. The upper fixture plate 52 is then placed over the probe tips 16 with the upper fixture plate bores 56 and 58 in axial alignment with the lower fixture plate bores 60 and 62. When assembled, the probes 10 are captured by the fixture 50, which permits the probe tip 16 and closed coils 30 to freely move in and out of the fixture bores 62 and 56 when contacting a device under test, but retains the open coils 28.

When the probes 10A and 10B are in contact with a device under test 70, each plunger tail 24 extends into the respective closed coils 30 to ensure good and consistent electrical contact from the device under test 70 to the probe tip 16, through the probe body 22 and tail 24 to the closed coils 30 and to the test unit 72. Additionally, the probe's resistance is relatively low because the electrical path is short and only travels laterally through the closed coils 30. The probe body 22 and/or tail 24 may be slightly curved or bent (not shown) to promote contact between the tail 24 and the closed coils 30.

Referring to FIGS. 4–6, probe 10 is shown with an end cap 31 which may be placed over the closed coils 30 to provide a double ended probe. End cap 31 may be hollow and may be soldered to the closed coils 31 or may include barbs or an internal ridge (not shown) to secured the cap to the coils. The tip of end cap 31 is illustrated is a 120° convex tip which is used to test plated through holes, pads and lands. This tip is one example of many probe tips that may be used. The particular tip configuration may be chosen as appropriate for a particular use or application. It should be understood that the tip illustrated and the types of tips listed hereinabove are for illustrative purposes only and not as limitations or as an exhaustive list.

When the probes 10A and 10B are in contact with a device under test 70, each plunger tail 24 extends into the respective closed coils 30 to ensure good electrical contact from the device under test 70 to the probe tip 16, through the probe body 22 and tail 24 to the closed coils 30 and end cap 31 to the test unit 72. The probe body 22 and/or tail 24 may be slightly curved or bent (not shown) to promote contact between the tail 24 and the closed coils 30.

It is to be understood that while certain forms of this invention have been illustrated and described, it is not limited thereto, except in so far as such limitations are included in the following claims and allowable equivalents thereof.

Having thus described the invention, what is claimed as new and desired to be secured by Letters Patent is as follows:

1. A contact spring probe comprising:
    a plunger having a head, a neck extending from said head, a shoulder extending from said neck, a body having a cross sectional area extending from said head, and a tail having a cross sectional area extending from said body, said head having a base extending perpendicularly from said neck and a taper from said base to said body, said base having a cross sectional area greater than said neck, and
    a spring having open coils having an inside diameter and separating opposed first and second closed coils each having an inside diameter,
    said inside diameter of said open coils greater than said inside diameter of said closed coils and said cross sectional area of said body and said cross sectional area of said tail,
    said first closed coils contacting said neck of said plunger between said base of said shoulder and said head,
    said base of said shoulder securing said first closed coils around said neck,
    said body and tail of said plunger extending through said open coils,
    said tail contacting said second closed coils when said open coils are compressed,
    whereby said tail and body of said plunger are inserted into said first coils of said spring to said taper of said shoulder, said first closed coils expanded by said taper of said shoulder, said first closed coils contracting around said neck of said plunger between said head and said base of said shoulder, said base of said shoulder retaining said first closed coils and preventing said spring from slipping off said plunger.

2. The contact spring probe as set forth in claim 1 wherein said body of said plunger is curved.

3. The contact spring probe as set forth in claim 1 wherein said tail of said plunger is curved.

4. The contact spring probe as set forth in claim 1 further comprising an interposer having an open coil bore adapted to receive said open coils of said spring and separating opposed first and second closed coil bores adapted to receive said first and second closed coils of said spring.

5. The contact spring probe as set forth in claim 4 wherein said second closed coil bore is axially offset from said open coil bore.

6. The contact spring probe as set forth in claim 1 further comprising an end cap adapted to receive said second closed coils.

* * * * *